(12) United States Patent
Niebojewski et al.

(10) Patent No.: US 11,631,609 B2
(45) Date of Patent: Apr. 18, 2023

(54) METHOD FOR MANUFACTURING A MICROELECTRONIC DEVICE

(71) Applicant: COMMISSARIAT A L'ENERGIE ATOMIQUE ET AUX ENERGIES ALTERNATIVES, Paris (FR)

(72) Inventors: Heimanu Niebojewski, Grenoble (FR); François Andrieu, Grenoble (FR); Claire Fenouillet-Beranger, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 120 days.

(21) Appl. No.: 17/443,117

(22) Filed: Jul. 21, 2021

(65) Prior Publication Data

US 2022/0028728 A1 Jan. 27, 2022

(30) Foreign Application Priority Data

Jul. 22, 2020 (FR) ...................................... 20 07684

(51) Int. Cl.
*H01L 21/762* (2006.01)
*H01L 29/06* (2006.01)
(Continued)

(52) U.S. Cl.
CPC .. *H01L 21/76224* (2013.01); *H01L 21/76283* (2013.01); *H01L 27/13* (2013.01); *H01L 29/0603* (2013.01); *H01L 29/401* (2013.01)

(58) Field of Classification Search
CPC ......... H01L 21/76224; H01L 21/76283; H01L 27/13; H01L 29/0603
See application file for complete search history.

(56) References Cited

U.S. PATENT DOCUMENTS 5,773,151 A 6/1998 Begley et al.
2002/0079537 A1* 6/2002 Houston ................. H01L 21/84
257/349

(Continued)

FOREIGN PATENT DOCUMENTS

EP 3 531 444 A1 8/2019
FR 3 091 004 A1 6/2020
WO WO 2017/142849 A1 8/2017

OTHER PUBLICATIONS

French Preliminary Search Report dated Mar. 26, 2021 in French Application 20 07684 filed on Jul. 22, 2020, citing documents AA-AE & AO-AQ therein, 2 page (with English Translation of Categories of Cited Documents).

(Continued)

*Primary Examiner* — Joseph C. Nicely
(74) *Attorney, Agent, or Firm* — Oblon, McClelland, Maier & Neustadt, L.L.P.

(57) ABSTRACT

A method for manufacturing a microelectronic device from a semiconductor-on-insulator substrate, the device having active components formed in active areas of the substrate separated by isolation trenches and which are delimited by first sidewalls, the isolation trenches being filled, at least partially, with a first dielectric material, includes a step of chemically attacking a passive section of the first bottom of the isolation trenches configured to generate, at said section, a roughness quadratic mean comprised between 2 nm and 6 nm. The method also includes a step of forming a passive component covering the first dielectric material and directly above the passive section.

17 Claims, 10 Drawing Sheets

(51) Int. Cl.
*H01L 29/40* (2006.01)
*H01L 27/13* (2006.01)

(56) References Cited

U.S. PATENT DOCUMENTS

| | | |
|---|---|---|
| 2002/0171120 A1 | 11/2002 | Maeda et al. |
| 2012/0025345 A1 | 2/2012 | Botula et al. |
| 2014/0084412 A1 | 3/2014 | Chou et al. |
| 2018/0069079 A1 | 3/2018 | Fanelli et al. |
| 2020/0219760 A1 | 7/2020 | Kantarovsky et al. |
| 2022/0359479 A1* | 11/2022 | Feuillet ............ H01L 29/66462 |

OTHER PUBLICATIONS

U.S. Appl. No. 17/016,634, filed Sep. 10, 2020, 2021/0090884 A1, Niebojewski, H.
U.S. Appl. No. 16/716,659, filed Dec. 17, 2019, 2020/0203229 A1, Batude, P, et al.
U.S. Appl. No. 16/709,993, filed Dec. 11, 2019, 2020/0194273 A1, Reboh, S, et al.
U.S. Appl. No. 17/040,138, filed Sep. 22, 2020, 2021/0028231 A1, Andrieu, F.

\* cited by examiner

METHOD FOR MANUFACTURING A MICROELECTRONIC DEVICE

TECHNICAL FIELD

The invention relates to the field of methods for co-integrating microelectronic devices on a silicon-on-insulator ("SOI") substrate. In particular, the present invention aims to provide a method for manufacturing active, and in particular digital, components on or in the stack formed by the silicon layer and the insulator layer of the SOI substrate, and components, for example radiofrequency ("RF") or passive components, at areas for which the stack has been removed. In this respect, the method suggested in the context of the present invention allows getting rid of the presence of a trap-rich layer generally implemented in SOI HR substrates.

PRIOR ART

Silicon-On-Insulator ("SOI") substrates are nowadays widely used, and since many years, for the manufacture of microelectronic devices.

These substrates 1 comprise an insulating layer 3, interposed between a silicon layer 4 and a support substrate 2, intended to electrically isolate the components (in particular the transistors) of the same microelectronic device (FIG. 1).

However, whenever it is intended to manufacture radiofrequency (hereinafter abbreviated as "RF") devices or passive components such as inductances, this unique insulating layer is no longer enough to ensure an optimum operation of said devices. Indeed, when these operate, they are the centre of parasitic phenomena which disturb their operation and de facto affect their performances. Amongst the parasitic phenomena that might be observed, crosstalks, nonlinearities, or still Eddy Currents are the most common.

In order to overcome this problem, it has been suggested, in the document U.S. Pat. No. 5,773,151, a new type of SOI substrates (FIG. 2), called SOI RF substrate, and wherein a Trap-Rich layer 3' is interposed between the insulating layer 3 and the support substrate 2. In particular, the trap-rich layer 3' is intended to limit, and possibly suppress, these undesirable effects.

Moreover, SOI RF substrates seem to be the prime candidates for co-integration of RF and digital devices for example. Nonetheless, these digital devices, which may comprise in particular diodes, bipolar transistors or CMOS components, generally have their performances altered by the presence of the trap-rich layer.

Consequently, this co-integration requires forming SOI RF areas, and SOI areas devoid of any trap-rich layer, over the same substrate. Such a configuration is described in particular in the document US 2018/0069079. In particular, it is suggested in this document to form SOI RF areas in a SOI substrate by implementing a step of local implantation of species.

Nonetheless, the suggested method is not satisfactory.

Indeed, it is generally observed on completion of the implantation step, a lateral diffusion of the species which translates into a variability of the properties of the components formed over adjacent SOI areas.

Moreover, the presence of a trap-rich layer or of a trap-rich area according to the terms of the document US 2018/0069079 imposes constraints on the use of the considered substrate, and in particular constraints in terms of thermal budget.

Finally, the manufacture of digital components is generally accompanied with the formation of isolation trenches. These, whose main function consists in ensuring electrical insulation between the digital components, are barely valorised.

The present invention aims to provide a method for co-integration of logical, RF and/or passive components over the same substrate without having to resort to the formation of a trap-rich layer.

The present invention also aims to provide a method for co-integration of logical, RF and/or passive components over the same substrate allowing getting rid of the constraints imposed by a trap-rich layer.

The present invention also aims to provide a method for co-integration of logical, RF and/or passive components over the same substrate allowing valorising the space occupied by isolation trenches.

DISCLOSURE OF THE INVENTION

The aims of the present invention are, at least partially, achieved by a method for manufacturing a microelectronic device comprising:

a) a step of providing a semiconductor-on-insulator substrate comprising a support substrate over one face of which, called main face, rests at least two stacks each provided, in this order and starting from the main face, with a dielectric layer and with a semiconductor layer, each stack forming an island over which one or several active component(s) are intended to be formed, each island is laterally delimited by sidewalls, called first sidewalls, and the islands are separated from one another by at least one isolation trench which extends over at least the entirety of the thickness of the stack up to a first bottom formed on or in the support substrate, each isolation trench being intended to be filled with a first dielectric material, b) a step of roughening a passive section of the first bottom of the isolation trench intended to generate, at said section, a roughness quadratic mean comprised between 2 nm and 6 nm, c) a step of forming a component, called passive component, covering the first dielectric material and directly above the passive section.

In an alternative definition, the invention relates on a method for manufacturing a microelectronic device comprising:

a) a step of providing a semiconductor-on-insulator substrate comprising a support substrate over one face of which, called main face, rests at least two stacks each provided, in this order and starting from the main face, with a dielectric layer and with a semiconductor layer, each stack forming an island over which one or several active component(s) are intended to be formed, each island is laterally delimited by sidewalls, called first sidewalls, and the islands are separated from one another by at least one isolation trench which extends over at least the entirety of the thickness of the stack up to a first bottom formed on or in the support substrate, each isolation trench being intended to be filled with a first dielectric material, b) a step of roughening a passive section of the first bottom of the isolation trench intended to generate, at said section, a roughness quadratic mean comprised between 2 nm and 6 nm, the roughness quadratic mean being measured in the spatial frequency range from 20 $\mu m^{-1}$ to 50 $\mu m^{-1}$, c) a step of forming a component, called passive component, covering the first dielectric material and directly above the passive section.

According to one implementation, the roughening step b) comprises an etching executed by means of a liquid etching solution, the liquid etching solution advantageously comprising at least one of the solutions selected amongst: a SC1 solution, a pure ammonia solution, a TMAH or KOH solution.

According to one implementation, step a) comprises the sequence of the following steps:

a step a1) of forming a dielectric material layer of, advantageously formed by a silicon oxide layer, and covering the semiconductor layer of the semiconductor-on-insulator substrate;

a step a2) of forming a hard mask intended to delimit the isolation trenches;

a step a3) of forming the isolation trenches.

According to one implementation, the method comprises a step e2) of filling the isolation trenches with the first dielectric material.

According to one implementation, the method comprises, after execution of step e2), a sequence e3) leading to the formation of the active components on or in the semiconductor layer at the islands.

According to one implementation, the method comprises a step e4), executed after the sequence e3), of forming an encapsulation layer covering the islands and the first material filling the isolation trenches.

According to one implementation, the method comprises a step e5), executed after step e4), of forming electrical contacts passing through the encapsulation layer and intended to electrically contact the active components.

According to one implementation, at step e4), an intermediate layer is also formed between the encapsulation layer and the first material filling the isolation trenches, the intermediate layer being made of a second material different from the first material and from the material forming the encapsulation layer.

According to one implementation, step b) is executed before step e2).

According to one implementation, step b) is preceded by step e1) of forming a protective layer covering the islands and the first sidewalls, said protective layer being intended to protect the first sidewalls during the execution of step b).

According to one implementation, step b) is executed after step e4).

According to one implementation, step b) is preceded by a sequence which comprises the following steps:

a step e6) of forming a through opening passing through the encapsulation layer and the intermediate layer, directly above the passive section, said through opening having a characteristic dimension smaller than one-tenth the distance between the first sidewalls of the trench, the through opening being delimited by second sidewalls and a second bottom at which the first dielectric material is exposed to the external environment, a step e7) of forming a protective layer covering the second sidewalls, and leaving the second bottom exposed to the external environment, a step e8) of selective and partial etching the first dielectric material opposite the protective layer and the intermediate layer so as to form a cavity in the first dielectric material and delimited by a bottom forming the passive section, by third sidewalls formed by the first dielectric material that has not been etched during said etching step, and by a ceiling at the intermediate layer.

According to one implementation, step b) is followed by a step e9) intended to fill in the through opening with a third dielectric material.

According to one implementation, the third dielectric material also lines the passive section, the third sidewalls and the ceiling of the cavity.

The invention also relates to a microelectronic device formed over a support substrate and over one face of which, called main face, islands rests each comprising a stack, the stack being provided, in this order and starting from the main face, with a dielectric layer and with a semiconductor layer, the islands being laterally delimited by sidewalls, called first sidewalls, and being separated from one another by isolation trenches which extend over at least the entirety of the thickness of the stack up to a first bottom formed on or in the support substrate, the device comprising a passive section on the first bottom of the isolation trenches which has a roughness quadratic mean comprised between 2 nm and 6 nm, and the device further comprising a component, called passive component, covering a first dielectric material filling the isolation trenches and directly above the passive section.

BRIEF DESCRIPTION OF THE DRAWINGS

Other features and advantages will appear in the following description of a method for manufacturing a microelectronic device according to the invention, provided as non-limiting examples, with reference to the appended drawings in which:

FIG. 14 is a representation of step e6);

FIG. 15 represents etching leading to the formation of said opening at the encapsulation layer;

FIG. 16 represents etching leading to the formation of said opening at the intermediate layer;

FIG. 24 illustrates an atomic microscopy image of the passive section before filling of the corresponding trench with

DETAILED DISCLOSURE OF PARTICULAR EMBODIMENTS

The present invention relates to a method for co-integrating active components and passive components from a SOI substrate formed by a support substrate and over a face of which, called main face, rests a stack provided, in this order and starting from the main face, by a dielectric layer and by a semiconductor layer. Advantageously, the SOI substrate may be a Fully Depleted Silicon on Insulator ("FDSOI") substrate.

In particular, the active components rest on or in islands (forming active areas) which comprise the stack. Moreover, the islands are laterally delimited by first sidewalls, and are separated from one another by isolation trenches which extend over at least the entirety of the thickness of the stack up to a first bottom formed on or in the support substrate.

Moreover, the isolation trenches are filled, at least partially, with a first dielectric material.

Moreover, the method according to the present invention comprises the execution of the following steps:

a) a step of providing a support substrate provided with islands comprising the stack and on which one or several active component(s) are intended to be formed, the islands are laterally delimited by sidewalls, called first sidewalls, and are separated from one another by isolation trenches which extend over at least the entirety of the thickness of the stack up to a first bottom formed on or in the support substrate, b) a step of roughening a passive section of the first bottom of the isolation trenches intended to generate, at said section, a roughness quadratic mean comprised between 2 nm and 6 nm, c) a step of forming a component, called passive component, covering the first dielectric material and, at least partially, directly above the passive section.

Thus, according to the present invention, the formation of the passive section, and in particular the generation of a roughness quadratic mean ("RMS roughness" or "Root Mean Square Roughness") at said passive section allows attenuating the crosstalks and/or parasitic currents generated by the passive components, and/or between adjacent active components.

Moreover, it should be understood that the roughness quadratic mean corresponds to a roughness RMS measured in the spatial frequency range from 20 $\mu m^{-1}$ to 50 $\mu m^{-1}$.

Figure 1:
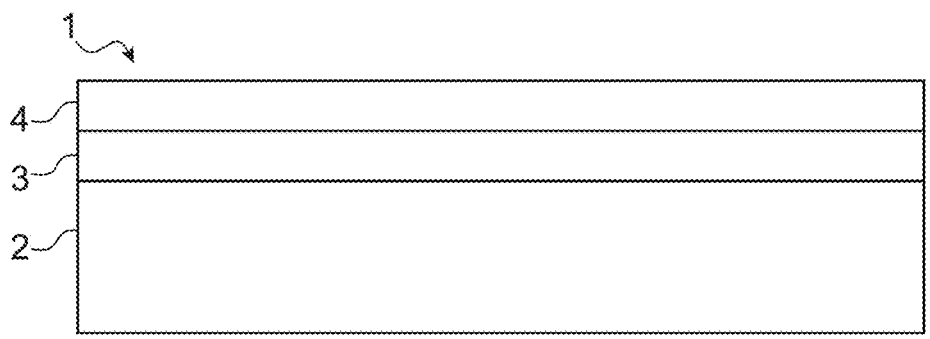
FIG. 1 is a schematic representation of a SOI substrate known from the state of the art and devoid of a trap-rich layer, the SOI substrate is represented in particular according to a sectional plane perpendicular to a main plane of said SOI substrate.
Figure 2:
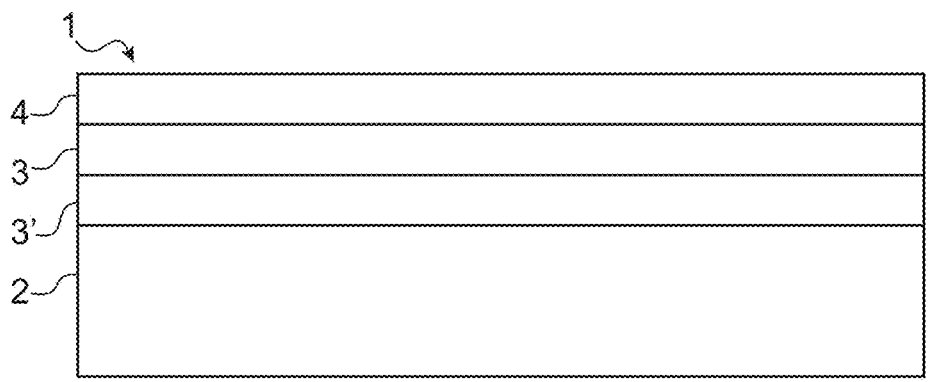
FIG. 2 is a schematic representation of a SOI RF substrate of the state of the art and provided with a trap-rich layer interposed between the insulator layer and the support substrate, the SOI RF substrate is represented in particular according to a sectional plane perpendicular to a main face of said SOI substrate.
Figure 3:
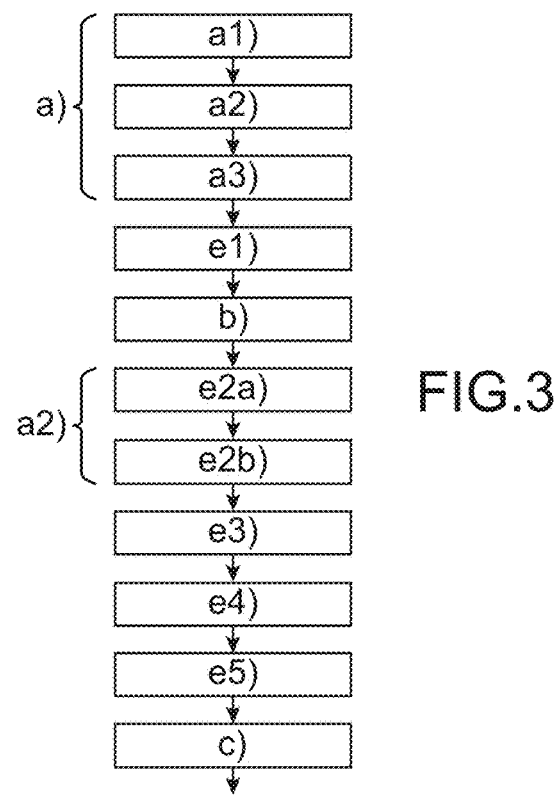
FIG. 3 is a representation of the implemented steps of the method for manufacturing a microelectronic device according to a first embodiment of the present invention.

FIGS. 3 to 14 are schematic representations of the different steps implemented in the context of a first embodiment of the present invention. In particular, FIG. 3 represents the sequence of the steps implemented in the context of this first embodiment.

This first embodiment involves a step a) of providing a support substrate 11 provided with islands 17 comprising the stack 12 and on which one or several active component(s) are intended to be formed.

The islands 17 are laterally delimited by sidewalls, called first sidewalls 19B, and are separated from one another by isolation trenches 19 which extend over at least the entirety of the stack 12 up to a first bottom 19A formed on or in the support substrate 11.

Figure 4:
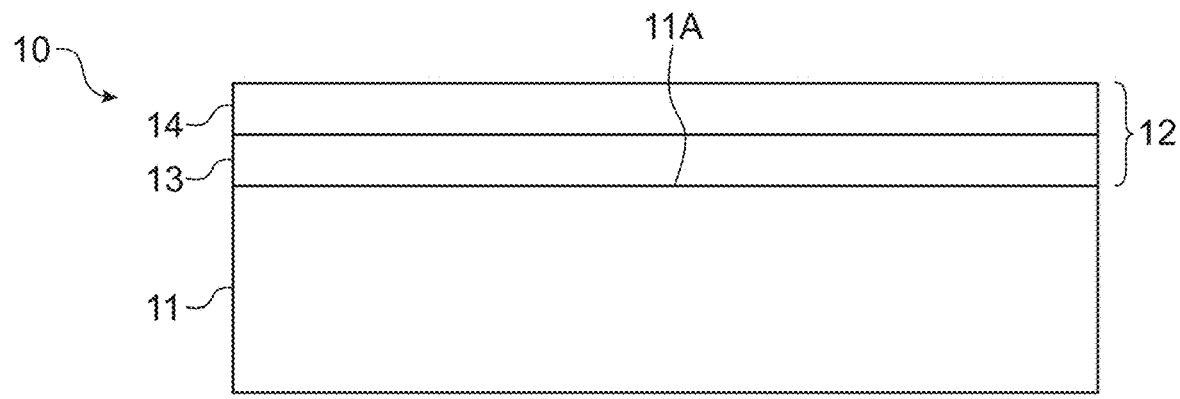
FIG. 4 is a schematic representation of a semiconductor-on-insulator substrate implemented in the context of a first embodiment of the present invention, the semiconductor-on-insulator substrate is represented in particular according to a sectional plane perpendicular to a main face of a support substrate from which the semiconductor-on-insulator substrate is formed.
Figure 5:
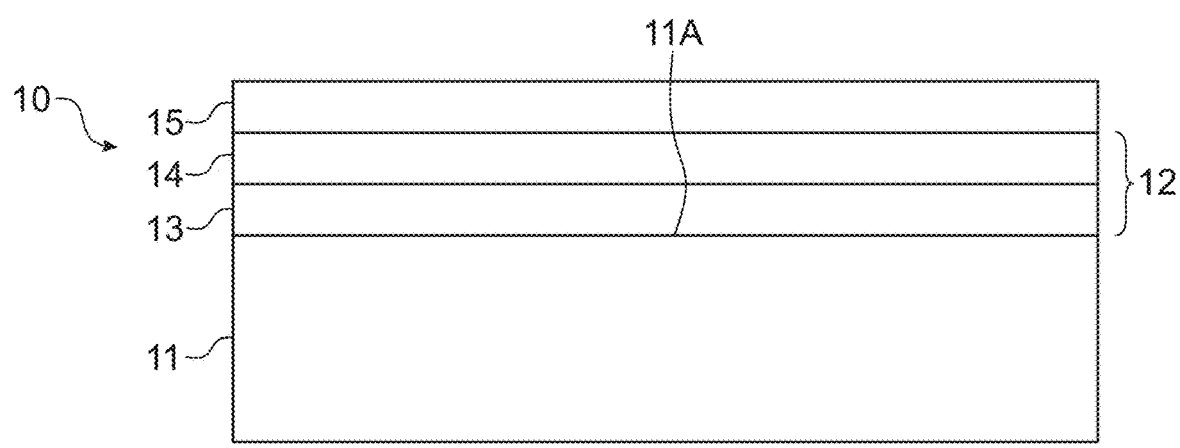
FIG. 5 is a schematic representation of a step a1) implemented in the context of the first embodiment of the present invention.

In particular, the support substrate 11 provided with the islands may be obtained in particular from a semiconductor-on-insulator substrate 10, which comprises the support substrate 11 and on a face of which, called main face 11a, the stack 12 rests. In particular, the stack is provided, in this order and starting from the main face 11a, with a dielectric layer 13 and with a semiconductor layer 14 (FIG. 4).

The support substrate 11 may comprise silicon.

The dielectric layer 13 may comprise silicon dioxide, and have a thickness comprised between 15 nm and 150 nm, more particularly between 5 nm and 50 nm.

The semiconductor layer 14 may comprise silicon, and have a thickness comprised between 3 nm and 30 nm.

Step a) may comprise steps a1), a2), and a3) (FIG. 3 and FIGS. 4 to 7).

In particular, step a1) comprises the formation of a dielectric material layer 15 (FIG. 5), advantageously formed by a silicon oxide layer, and covering the semiconductor layer 14. In particular, the dielectric material layer 15 may comprise silicon dioxide and have a thickness comprised between 5 nm and 30 nm.

Figure 6:
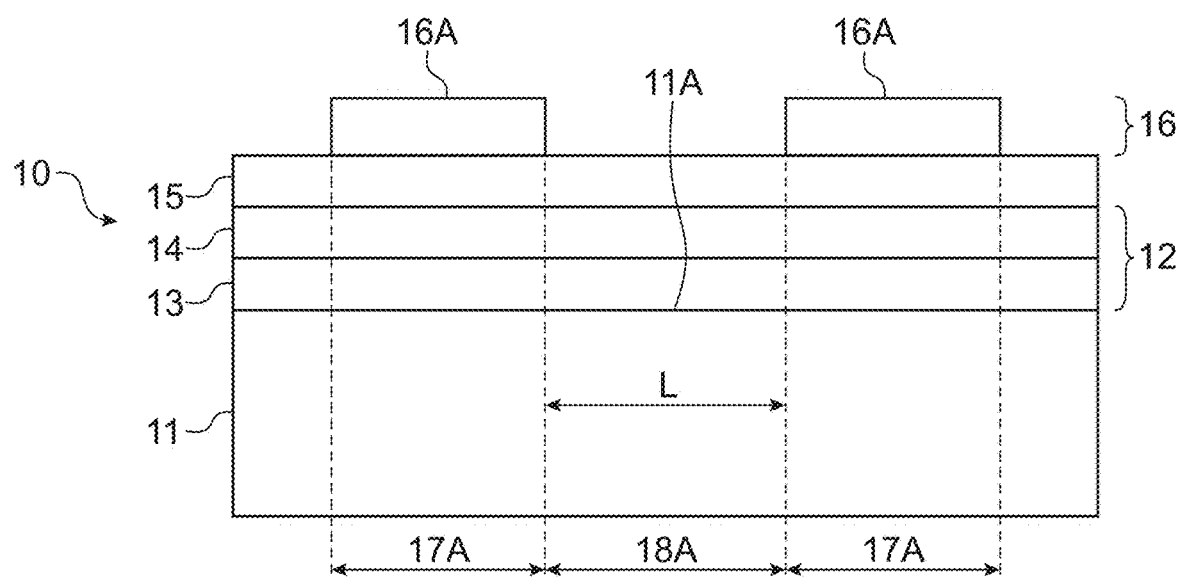
FIG. 6 is a schematic representation of a step of forming a hard mask over the dielectric material layer formed during the execution of step a2)

Step a2) comprises the formation of a hard mask 16, made for example of silicon nitride, over the dielectric material layer 15 (FIG. 6).

In particular, the formation of the hard mask 16 may involve the following steps:
the formation of a silicon nitride layer, with a thickness comprised between 5 nm and 50 nm,
the definition of masking areas 16A at the silicon nitride layer.

In particular, the masking areas 16A delimit active areas 17A (FIG. 6) which are separated by spaces, called vacant spaces 18A. The separation between adjacent active areas 17A may have a width L larger than 50 nm, and possibly larger than 500 nm. The definition of the masking areas 16A may involve in this order a photolithography step and an etching step.

Figure 7:
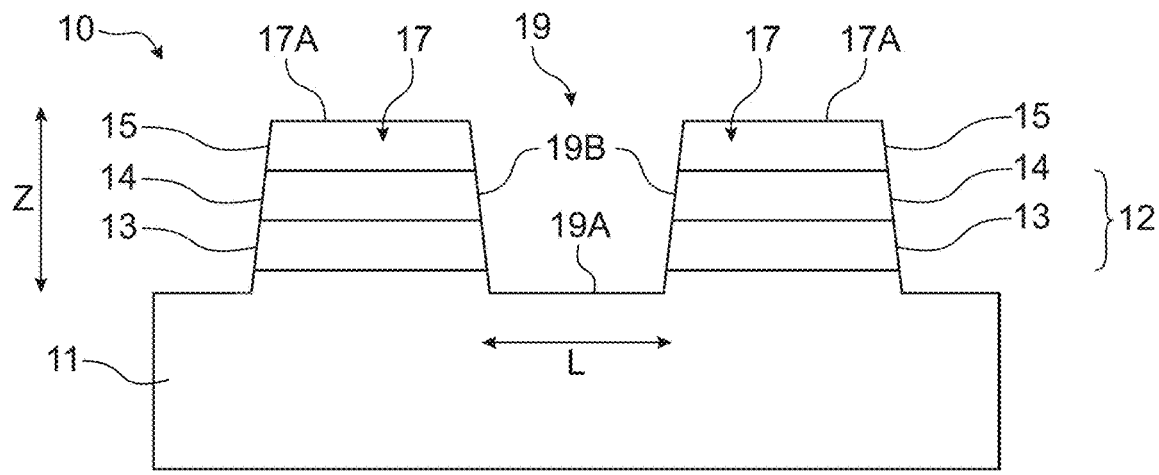
FIG. 7 is a schematic representation of a step a3) implemented in the context of the first embodiment of the present invention.

The formation of the hard mask 16 is then followed by step a3) which comprises the formation of isolation trenches 19 (FIG. 7). This step a3) comprises a step of etching, at the vacant spaces 18A, the dielectric material layer 15 and the stack 12 so as to form said isolation trenches 19. As illustrated in FIG. 7, this etching step also allows defining several islands 17, forming the active areas 17A. In this respect, the islands 17 are composed by the non-etched dielectric material layer 15 and stack 12, and are separated from one another by the isolation trenches 19. Each island 17 also has first sidewalls 19B laterally delimiting the isolation trenches 19. Each isolation trench 19 extends, according to a depth Z comprised between 30 nm and 300 nm, up to a first bottom 19A formed on the main face 11a of the support substrate 11 or in the support substrate 11.

Figure 8:
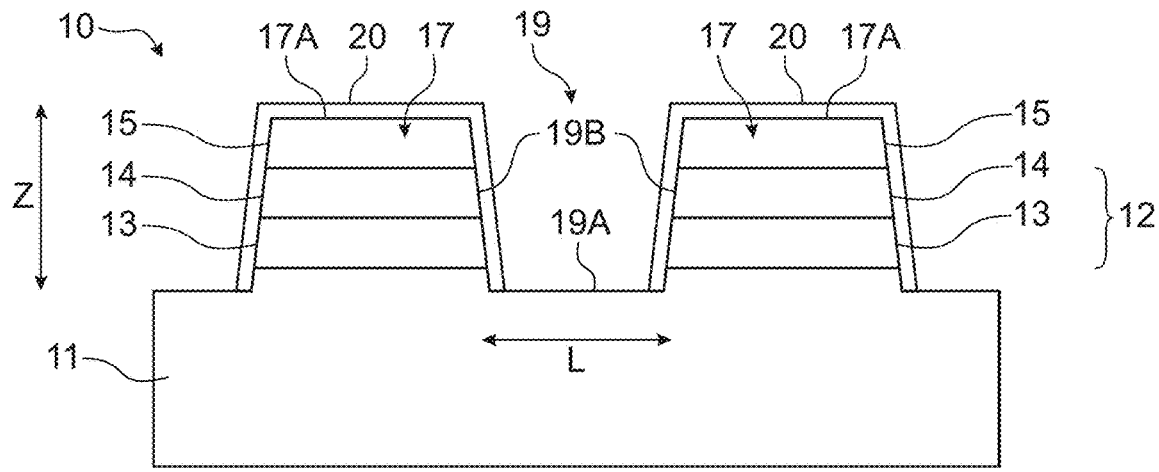
FIG. 8 is a schematic representation of a step e1) of forming a protective layer of the first sidewalls and of the active areas, and leaving the first bottoms exposed to the external environment, this step being implemented in the context of the first embodiment of the present invention.

The method according to the present invention may comprise, afterwards, a step e1) of forming a protective layer 20 covering the islands 17, that is to say the active areas 17A and the first sidewalls 19B (FIG. 8). In this respect, the formation of the protective layer 20 may comprise the deposition of a silicon nitride layer covering the active areas 17A, the first sidewalls 19B and the first bottoms 19A, and then a removal of said silicon nitride layer only at the first bottoms 19A.

Figure 9:
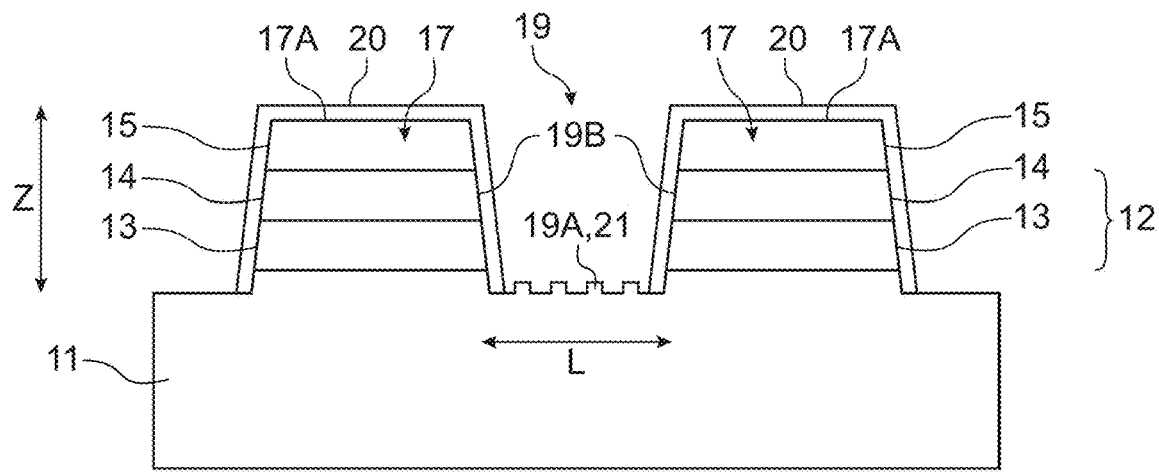
FIG. 9 is a schematic representation of a step b) implemented in the context of the first embodiment of the present invention.
Figure 10:
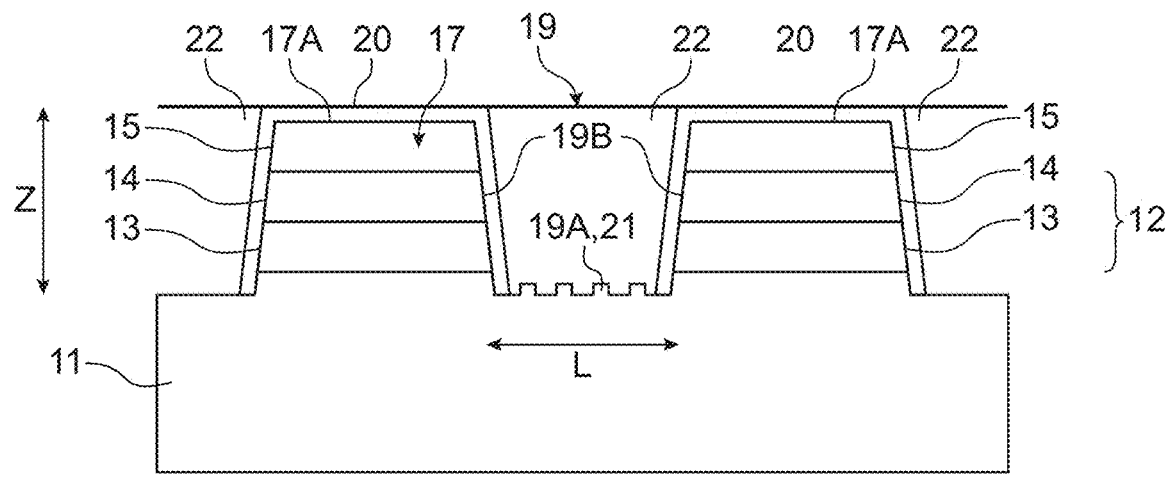
FIG. 10 is a schematic representation of a step e2) implemented in the context of the first embodiment of the present invention.

The method according to the present invention comprises a step b) of roughening at least one portion of the first bottom 19A of the isolation trenches intended to generate a passive section 21 over which a roughness quadratic mean is comprised between 2 nm and 6 nm (FIGS. 3 and 9).

According to the first embodiment, the passive section 21 is made directly over the first bottom 19A (FIG. 9). According to one variant, the passive section 21 could be made over a layer deposited beforehand over the first bottom 19A.

The roughening step b) may comprise a chemical attach and more particularly an etching executed by means of a liquid etching solution.

Advantageously, the liquid etching solution may comprise at least one of the solutions selected amongst: a SC1 solution, a pure ammonia solution, a TMAH or KOH solution. The concentrations and other operating parameters (such as the temperature, the duration) are adjusted by those skilled in the art, in order to generate a roughness quadratic mean comprised between 2 nm and 6 nm.

The protective layer 20 allows preserving the integrity of the active areas 17A and of the first sidewalls 19B, that is to say of the islands 17, during the execution of step b).

Afterwards, the isolation trenches 19 are filled with a first dielectric material 22 (FIG. 10) during the execution of a step e2).

For example, step e2) may comprise the following substeps:
a substep e2a) of forming a dielectric material layer covering the isolation trenches 19 and the active areas 17A.
a step e2b) of planarising the dielectric material layer leading to the exposure of the protective layer 20 at the active areas to the external environment. For example, this planarisation step e2b) is carried out by stopping etching over the protective layer 20 at the active areas.

In other words, upon completion of e2b), the surfaces exposed to the external environment of the first dielectric material 22 and of the protective layer 20 at the active areas are flush with one another.

Advantageously, step e2b) may be executed by Chemical Mechanical Polishing ("CMP").

The first dielectric material 22 may comprise silicon dioxide.

The protective layer 22 implemented in this manner is particularly advantageous for two reasons.

Indeed, first of all, it allows protecting the islands 17, the first sidewalls 19B during the execution of the roughening step b).

Secondly, the protective layer 20 constitutes a stop layer during the execution of the planarisation step e2b).

Figure 11:
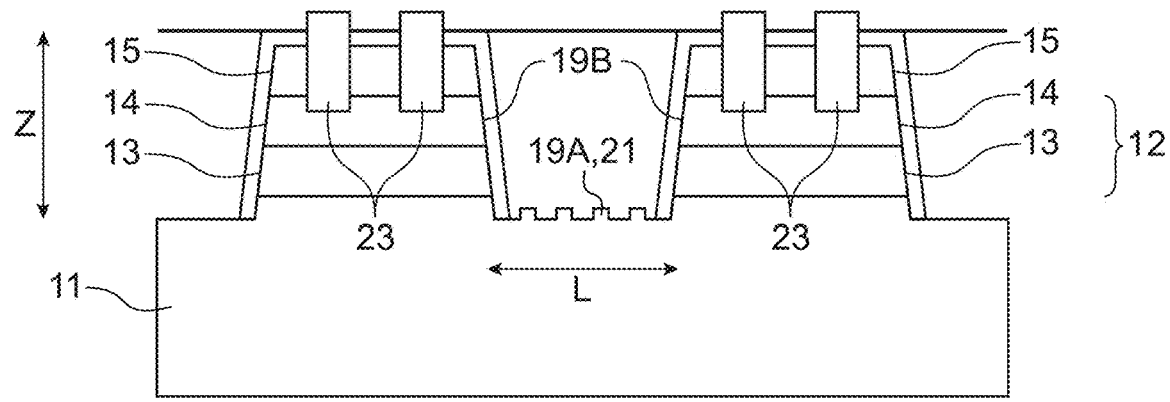
FIG. 11 is a schematic representation of a step e3) implemented in the context of the first embodiment of the present invention.

Step e2) of filling the isolation trenches 19 may be followed by a sequence e3) leading to the formation of the active components 23 on or in the semiconductor layer 14 at the active areas 17A (FIG. 11). In particular, this sequence may comprise the formation of gates, of source extension and of drain.

For example, the active components 23 comprise at least one of the components selected amongst: a CMOS transistor, a bipolar transistor, a diode.

Figure 12:
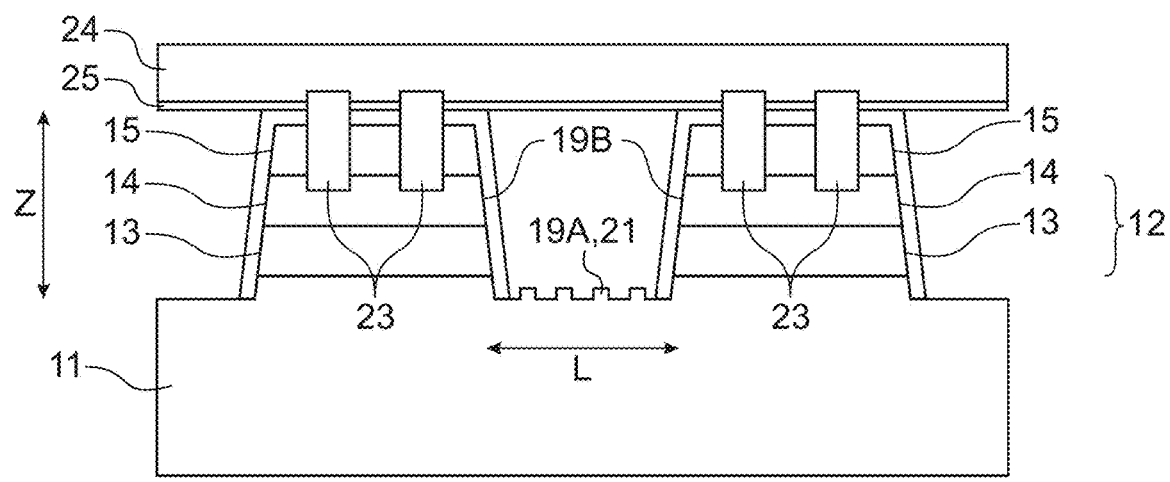
FIG. 12 is a schematic representation of a step e4) implemented in the context of the first embodiment of the present invention.
Figure 13:
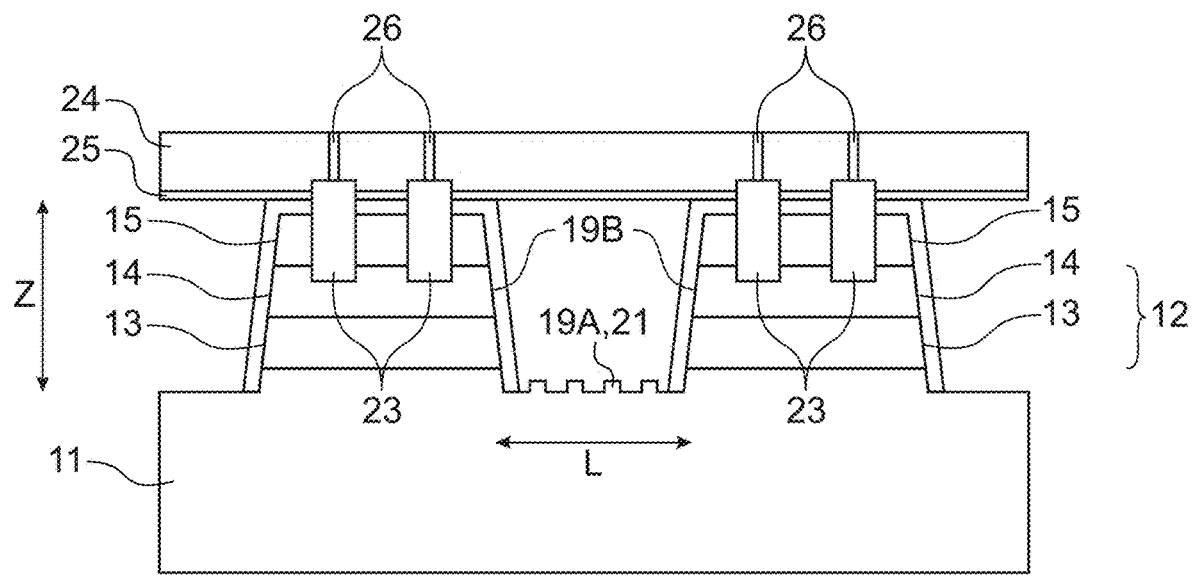
FIG. 13 is a schematic representation of a step e5) implemented in the context of the first embodiment of the present invention.

The step of forming the active components 23 is followed by a step e4) of forming an encapsulation layer 24 covering the active areas 17A and the first dielectric material 22 filling the isolation trenches 19 (FIG. 12).

The encapsulation layer 24 may comprise silicon dioxide.

An intermediate layer 25 may be formed, at step e4), between the encapsulation layer 24 and the first dielectric material 22 filling the isolation trenches 19.

Advantageously, the intermediate layer 25 is made of a second material different from the first dielectric material 22 and from the material forming the encapsulation layer. In particular, these differences between the materials allow considering the possibility of etching these in a selective manner. For example, the intermediate layer 25 may comprise silicon nitride.

The method may comprise a step e5) (FIG. 13), executed after step e4), of forming electrical contacts 26 intended to electrically contact the active components 23. In particular, the electrical contacts 26 cross the encapsulation layer 24, as well as the intermediate layer 25 if the latter is considered.

The formation of the electrical contacts 26 calls upon the general knowledge of those skilled in the art and is not therefore described in details in the present invention.

Figure 14:
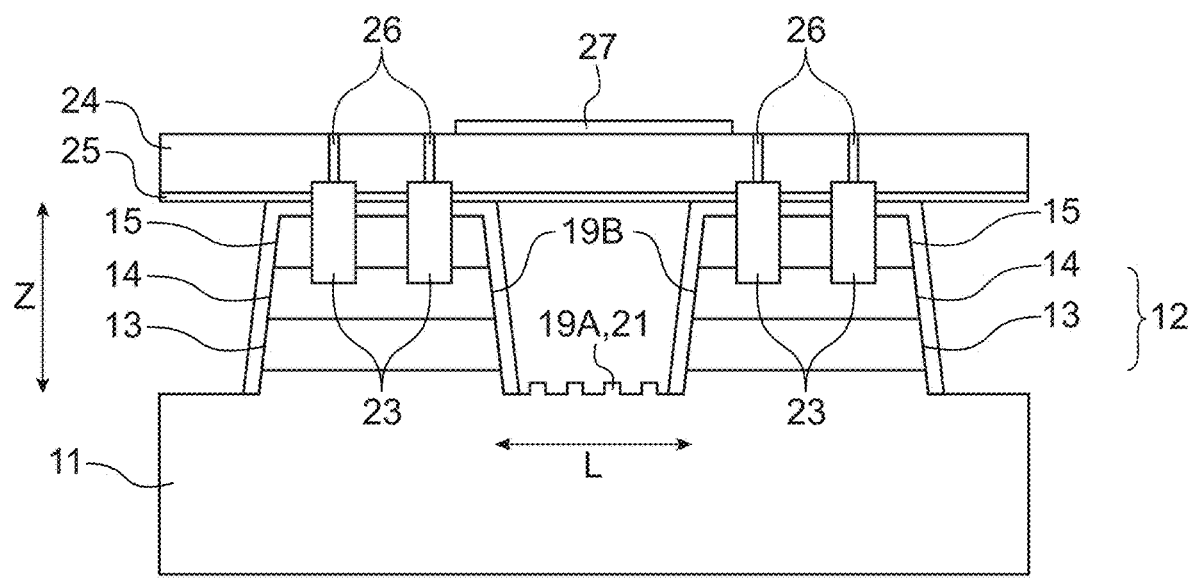
FIG. 14 is a schematic representation of a step c) implemented in the context of the first embodiment of the present invention.

Finally, the method according to the present invention comprises a step c) of forming a component, called passive component 27, covering the first dielectric material 22 and, at least partially, directly above the passive section 21. In particular, the passive components 27 may comprise inductances and/or RF components (FIG. 14).

By "directly above the passive section 21", it should be understood a passive component whose projection on the passive section is, at least partially, circumscribed by said passive section. In other words, the surface occupied by the passive components is smaller than that of the passive section.

The present invention also comprises a second embodiment illustrated in FIGS. 15 to 23.

Figure 15:
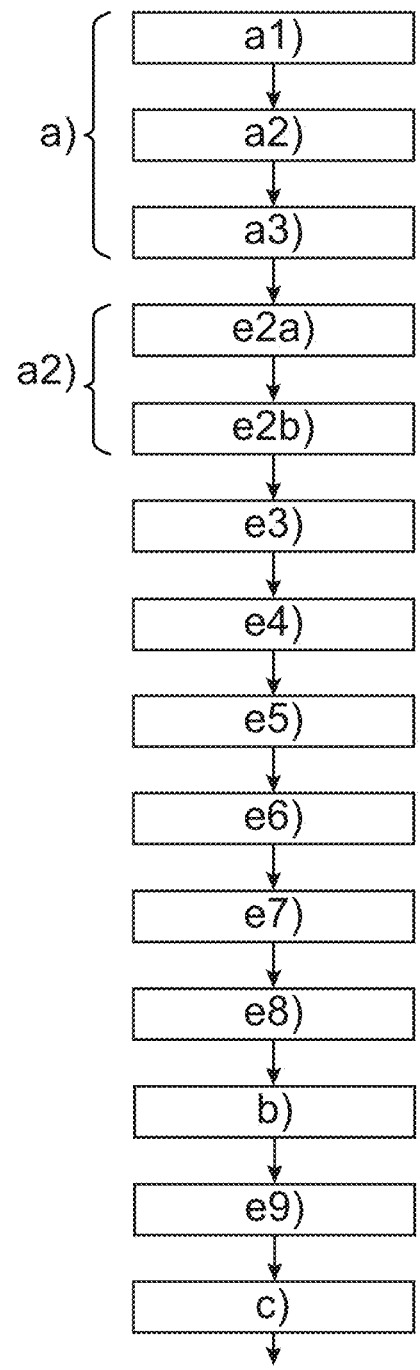
FIG. 15 is a representation of the steps implemented of the method for manufacturing a microelectronic device according to a second embodiment of the present invention.

In particular, FIG. 15 is a schematic representation of the sequence of the steps implemented according to this second embodiment.

This second embodiment differs from the first embodiment essentially in that steps e2), e3) and e4) are executed before the roughening step b), and step e1) is omitted.

Moreover, this second embodiment also comprises the execution of additional steps denoted e6), e7), e8) and e9), and described hereinafter.

The starting structure before the roughening step may differ from one embodiment to another.

Thus, first of all, this second embodiment comprises the execution of step a). Step a), as described in the context of the first embodiment, may comprise the following steps:
step a1) of forming the dielectric material layer 15;
step a2) of forming the hard mask 16;
step a3) of forming isolation trenches 19.

Still according to this second embodiment, step a) is followed by step e2) of filling the isolation trenches 19. Afterwards, step e3) of forming the active components 23 is carried out.

In this respect, the active components 23 are formed on or in the semiconductor layer 14 at the active areas 17A. In particular, this sequence may comprise the formation of gates, source extension and drain.

For example, the active components 23 comprise at least one of the components selected amongst: a CMOS transistor, a bipolar transistor, a diode.

The step of forming the active components 23 is followed by step e4) of forming, in this order, the intermediate layer 25 and the encapsulation layer 24 covering the active areas 17A and the first dielectric material 22 filling the isolation trenches 19.

Step e5) is executed after step e4), to form the electrical contacts 26 intended to electrically contact the active components 23.

Figure 16:
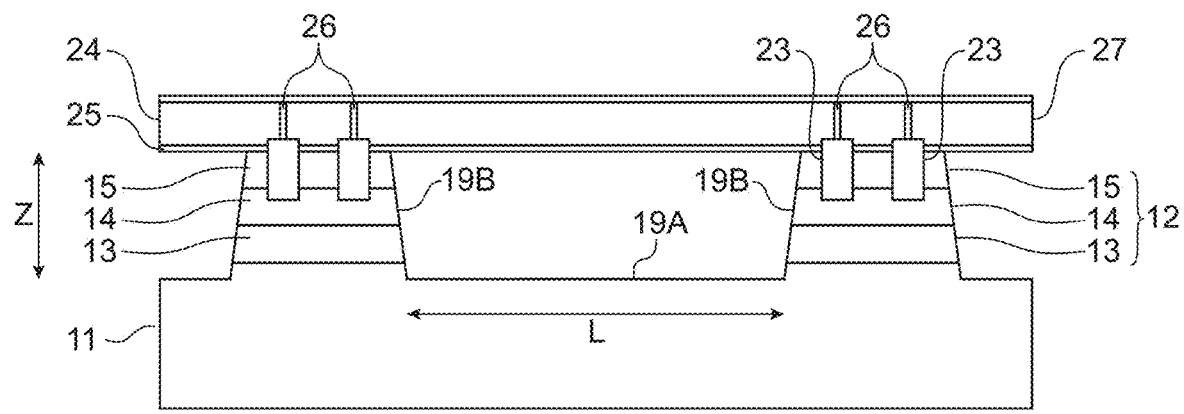
FIG. 16 is a schematic representation of a method for manufacturing a microelectronic device in the context of a second embodiment of the present invention, in particular

Thus, FIG. 16 is an illustration of the microelectronic device obtained upon completion of step e5) of the manufacturing method, according to the second embodiment of the present invention.

Figure 17:
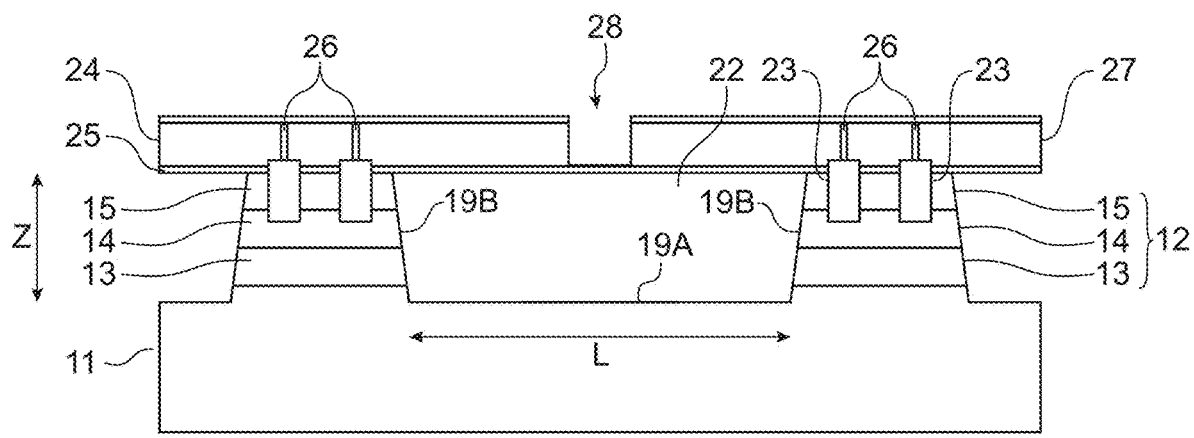
FIG. 17 is a schematic representation of a step of forming a through opening in the intermediate layer and in the encapsulation layer according to the second embodiment, in particular.
Figure 18:
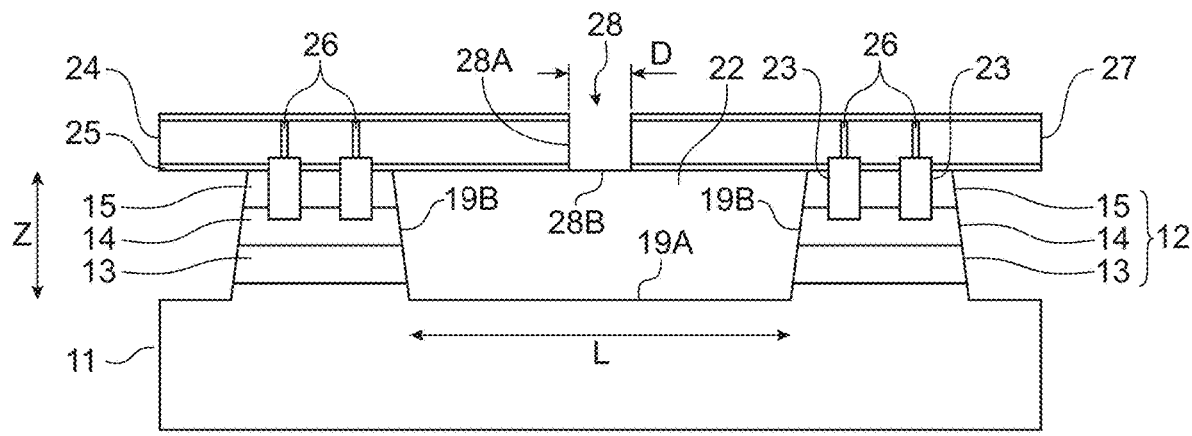
FIG. 18 is a schematic representation of step e6) of forming a through opening in the intermediate layer and in the encapsulation layer according to the second embodiment, in particular.

This second embodiment comprises a step e6) of forming a through opening 28 passing through the encapsulation 24 and intermediate 25 layers (FIGS. 17 and 18).

For example, the through opening 28 may be formed in two successive steps which comprise, in this order, an etching at the encapsulation layer 24 (FIG. 17) and an etching at the intermediate layer 25 (FIG. 18).

The formation of the through opening 28 may implement a hard mask 27 (FIGS. 17 and 18).

Moreover, the through opening 28 is formed directly above the first bottom 19A of the isolation trench 19. According to the illustrated example, the through opening 28 is formed halfway between two adjacent islands 17. According to a non-illustrated variant, the through opening 28 is formed closer to one of the two islands.

The through opening 28 has a characteristic dimension D smaller than one-tenth the width L (FIG. 18). For example, the characteristic dimension D may be comprised between 20 nm and 100 nm.

By "characteristic dimension", it should be understood a dimension of a section according to a plane perpendicular to the extension of said through opening. The section may be shaped as a circle, a square or a rectangle. The characteristic dimension of a circle is its diameter, that of a square or of a rectangle corresponds to a diagonal.

Moreover, the through opening 28 is delimited by second sidewalls 28A and by a second bottom 28B at which the first dielectric material 22 is exposed to the external environment.

Figure 19:
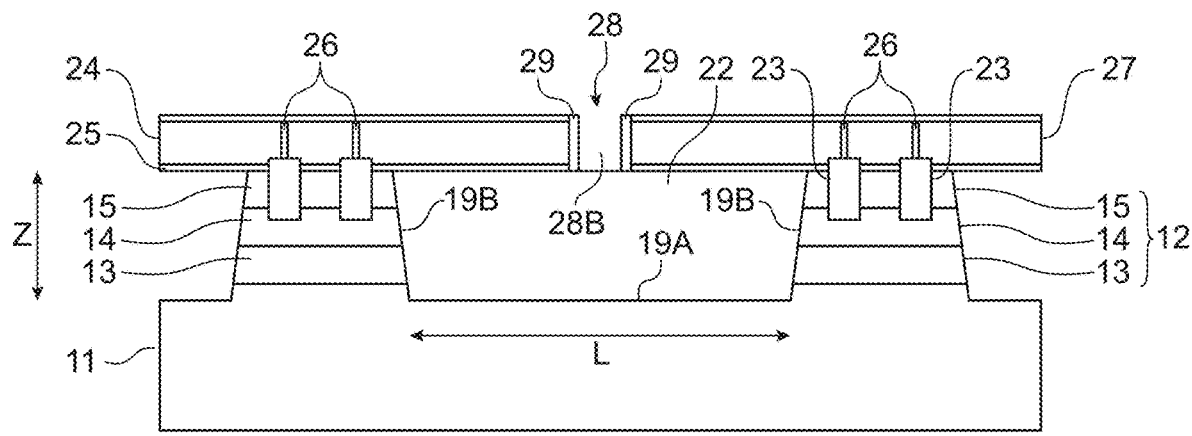
FIG. 19 is a schematic representation of step e7) of forming a protective layer over the second sidewalls of the through openings and implemented in the context of the second embodiment of the present invention.

A protective layer 29 covering the second sidewalls 28A, and leaving the second bottom 28 exposed to the external environment, may be formed at a step e7) (FIG. 19). The protective layer 29 may be of the same chemical nature as the intermediate layer 25 and, for example, comprise silicon nitride.

Figure 20:
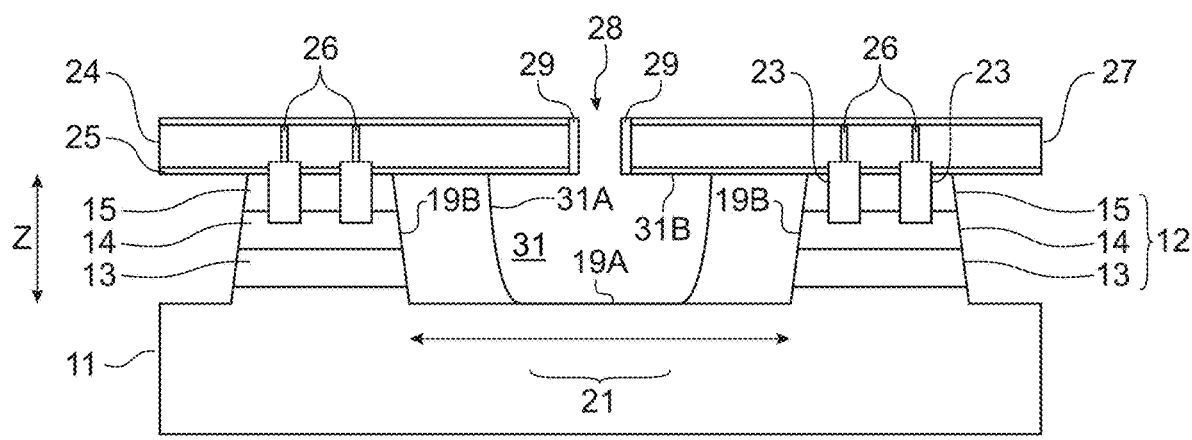
FIG. 20 is a schematic representation of a step e8) of forming a cavity in the first dielectric material according to the second embodiment of the present invention.

The formation of the protective layer 29 is followed by a step e8) of selective etching of the first dielectric material 22 opposite the protective layer 29 and the intermediate layer 25 (FIG. 20).

In particular, etching is executed so as to form a cavity 31 in the first dielectric material 22. Etching of the first dielectric material 22 is partial laterally, and complete over the entirety of the thickness of said first dielectric material. In other words, this etching step allows preserving blocks 30 of the first dielectric material 22 and uncovering a passive section 21 at the first bottom 19A. Moreover, the blocks 30 carry third sidewalls 31A and thus laterally delimit the cavity 31. In other words, the blocks 30 isolate said cavity 31 from the first sidewalls 19B.

Figure 21:
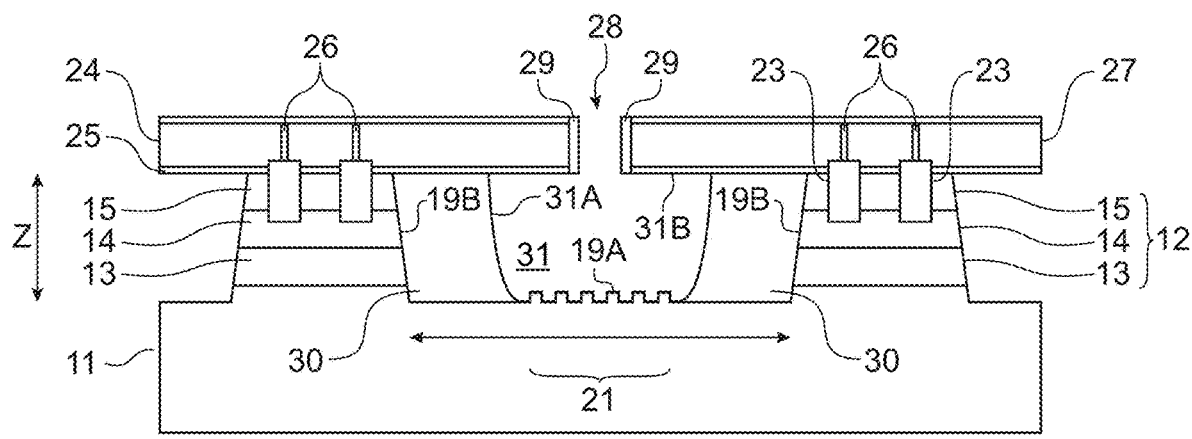
FIG. 21 is a schematic representation of a step b) of roughening the passive section according to the second embodiment of the present invention.

The formation of the cavity 31 is then followed by step b) of roughening the passive section 21 in order to generate, at said section, a roughness quadratic mean comprised between 2 nm and 6 nm (FIG. 21).

The cavity formed in this manner is also delimited by the passive section 21 at the first bottom 19A and by a ceiling 31B at the intermediate layer 25, both being connected by the third sidewalls 31A. It goes without saying, yet without it being necessary to specify it, that given the presence of the blocks 30, the surface of the passive section 21 is smaller than that of the first bottom 19A.

Step b) is then followed by a step e9) intended to fill in the through opening with a third dielectric material 33, for example made of silicon nitride.

Figure 22:
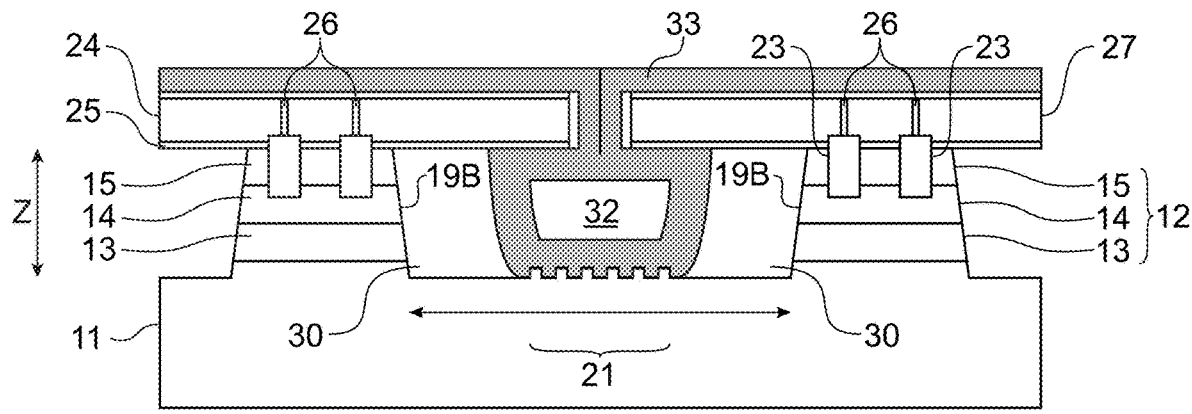
FIG. 22 is a schematic representation of a step e9) intended to fill in with a third dielectric material the through openings according to the second embodiment of the present invention.

This step could be limited to filling in the through opening. Nonetheless, the third dielectric material could also line the passive section 21, the third sidewalls 31A and the ceiling 31B of the cavity 31 (FIG. 22).

In this respect, step e9) could be executed by means of an Atomic Layer Deposition ("ALD") of the third dielectric material.

This deposition technique known for its conformity allows depositing a layer comprising the third dielectric material over the second walls, the third walls, the passive section and the ceiling. In particular, as step e9) progresses, the through opening is filled with the third dielectric material until the time when the latter is fully obstructed. At this point of time, the formation of the dielectric material layer in the cavity 31 ceases, and thus leaves a section with an empty volume in said cavity.

Alternatively, step e7) may comprise a Plasma Enhanced Chemical Vapor Deposition ("PECVD").

Figure 23:
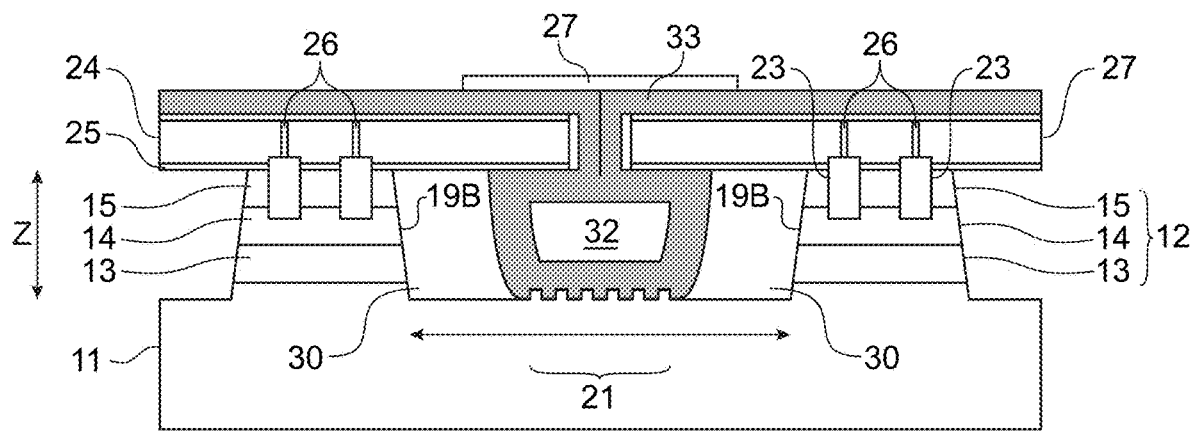
FIG. 23 is a schematic representation of a step c) implemented in the context of the second embodiment of the present invention.

Finally, the method according to the present invention comprises step c) of forming the passive component 27, covering the first dielectric material 22 and directly above the passive section 21 (FIG. 23). In particular, the passive component 27 may comprise inductances and/or RF components.

The implementation of a passive section 21 that has a roughness comprised between 2 nm and 6 nm, and directly above which is formed, at least partially, the passive component, allows limiting crosstalks between the passive components, but also between the active components 23.

Moreover, the implementation of this passive section allows getting rid of the presence of a trap-rich layer as suggested in the state of the art.

Finally, the formation of the passive components, at least partially, directly above the passive sections 21, and consequently the isolation trenches 19, allows positively addressing the problems of miniaturisation of microelectronic components.

Figure 24:
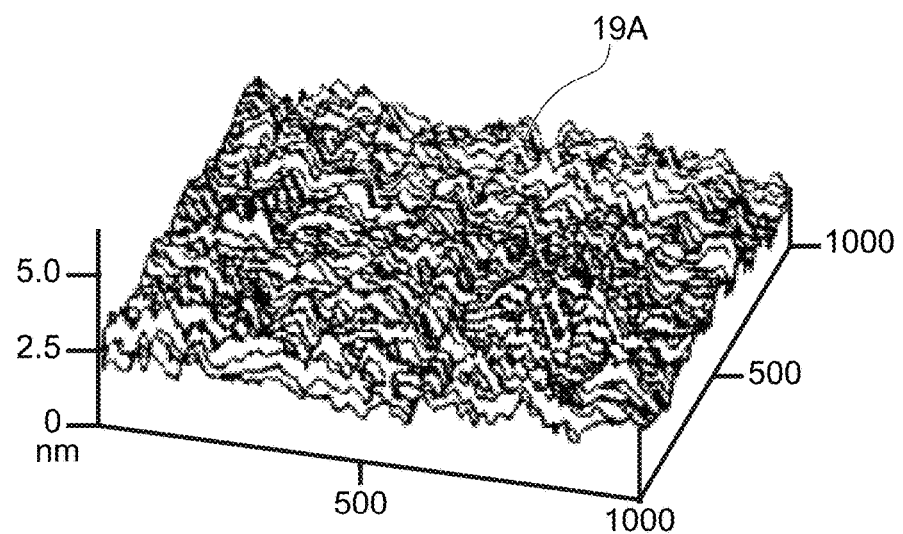

It should be noted that in the context of the invention and as shown in FIG. 24, at the step of roughening the passive section 21, whether it is done according to the first or second embodiment, it is possible to observe c the roughness of the passive section 21 by carrying out an atomic force microscopy measurement during the manufacture. According to this possibility, the roughness quadratic mean could be calculated by means of 1 µm by 1 µm atomic force microscopy images according to the standard ISO4287. Thus, FIG. 24 illustrates an atomic force microscopy image performed on the first bottom 19A at the passive section 21 just after the roughening step.

It should be noted that, in the context of the invention, the feature according to which the device comprises a passive section 21 over the first bottom 19A of the isolation trenches 19 which has a roughness quadratic mean comprised between 2 nm and 6 nm, while the trench is filled with a dielectric material could be checked in different ways on a functional microelectronic device:
 either by performing a selective physico-chemical attack so as to selectively suppress the dielectric material and provide access to the passive section,
 or by means of a transmission electron microscopy, the device having been thinned beforehand to enable such a microscopy.

Although they are destructive, both these two measuring possibilities allow assessing the proper reproducibility of the feature regarding the roughness of the passive sections 21.

The invention claimed is:

1. A method for manufacturing a microelectronic device comprising:
 a) a step of providing a semiconductor-on-insulator substrate comprising a support substrate over one face of which, called main face, rests at least two stacks each provided, in this order and starting from the main face, with a dielectric layer and with a semiconductor layer, each stack forming an island over which one or several active component(s) are intended to be formed, each island being laterally delimited by sidewalls, called first sidewalls, and the islands being separated from one another by at least one isolation trench which extends over at least the entirety of a thickness of the stack up to a first bottom formed on or in the support substrate, each isolation trench being configured to be filled with a first dielectric material,
 b) a step of roughening a passive section of the first bottom of the isolation trench configured to generate, at said section, a roughness quadratic mean comprised between 2 nm and 6 nm, and
 c) a step of forming a component, called passive component, covering the first dielectric material and directly above the passive section.

2. The method according to claim 1, wherein the roughening step b) comprises an etching executed by means of a liquid etching solution.

3. The method according to claim 2 wherein the liquid etching solution comprises at least one of the solutions selected amongst: a SC1 solution, a pure ammonia solution, a TMAH or KOH solution.

4. The method according to claim 1, wherein step a) comprises the sequence of the following steps:
 a step a1) of forming a dielectric material layer, covering the semiconductor layer of the semiconductor-on-insulator substrate;
 a step a2) of forming a hard mask intended to delimit the isolation trenches; and
 a step a3) of forming the isolation trenches.

5. The method according to claim 4, wherein in a step a1) the dielectric material layer is formed by a silicon oxide layer.

6. The method according to claim 4, wherein the method comprises a step e2) of filling the isolation trenches with the first dielectric material.

7. The method according to claim 6, wherein step b) is executed before step e2).

8. The method according to claim 7, wherein step b) is preceded by step e1) of forming a protective layer covering the islands and the first sidewalls, said protective layer being configured to protect the first sidewalls during the execution of step b).

9. The method according to claim 6, wherein the method comprises, after execution of step e2), a sequence e3) leading to the formation of the active components on or in the semiconductor layer at the islands.

10. The method according to claim 9, wherein the method comprises a step e4), executed after the sequence e3), of forming an encapsulation layer covering the islands and the first material filling the isolation trenches.

11. The method according to claim 10, wherein the method comprises a step e5), executed after step e4), of forming electrical contacts passing through the encapsulation layer and configured to electrically contact the active components.

12. The method according to claim 11, wherein, at step e4), an intermediate layer is also formed between the encapsulation layer and the first material filling the isolation trenches, the intermediate layer being made of a second material different from the first material and from the material forming the encapsulation layer.

13. The method according to claim 12, wherein step b) is executed after step e4).

14. The method according to claim 13, wherein step b) is preceded by a sequence which comprises the following steps:
 a step e6) of forming a through opening passing through the encapsulation layer and the intermediate layer, directly above the passive section, said through opening having a characteristic dimension smaller than one-tenth a distance between the first sidewalls of the trench, the through opening being delimited by second sidewalls and a second bottom at which the first dielectric material is exposed to the external environment,
 a step e7) of forming a protective layer covering the second sidewalls, and leaving the second bottom exposed to the external environment, and
 a step e8) of selective and partial etching the first dielectric material opposite the protective layer and the intermediate layer so as to form a cavity in the first dielectric material and delimited by a bottom forming the passive section, by third sidewalls formed by the first dielectric material that has not been etched during said etching step, and by a ceiling at the intermediate layer.

15. The method according to claim 14, wherein step b) is followed by a step e9) configured to fill in the through opening with a third dielectric material.

16. The method according to claim 15, wherein the third dielectric material also lines the passive section, the third sidewalls and the ceiling of the cavity.

17. A microelectronic device comprising a support substrate having a main face, and islands resting on the main face, each of the islands comprising a stack, the stack being provided, in this order and starting from the main face, with a dielectric layer and with a semiconductor layer, the islands being laterally delimited by sidewalls, called first sidewalls, and being separated from one another by isolation trenches which extend over at least the entirety of the thickness of the stack up to a first bottom formed on or in the support substrate, the device comprising a passive section on the first bottom of the isolation trenches which has a roughness quadratic mean comprised between 2 nm and 6 nm, and the device further comprising a component, called passive component, covering a first dielectric material filling the isolation trenches and directly above the passive section.

* * * * *